US009285555B2

(12) United States Patent
Yabre (10) Patent No.: US 9,285,555 B2
(45) Date of Patent: Mar. 15, 2016

(54) OPTICAL CIRCUIT BOARD

(76) Inventor: Gnitabouré Yabre, Mainvilliers (FR)

( * ) Notice: Subject to any disclaimer, the term of this patent is extended or adjusted under 35 U.S.C. 154(b) by 178 days.

(21) Appl. No.: 13/989,610

(22) PCT Filed: Nov. 25, 2011
(Under 37 CFR 1.47)

(86) PCT No.: PCT/IB2011/003196
§ 371 (c)(1),
(2), (4) Date: Feb. 18, 2014

(87) PCT Pub. No.: WO2012/069929
PCT Pub. Date: May 31, 2012

(65) Prior Publication Data
US 2014/0348462 A1     Nov. 27, 2014

(30) Foreign Application Priority Data
Nov. 25, 2010    (WO) ................. PCT/IB2010/003429

(51) Int. Cl.
*G02B 6/12*     (2006.01)
*G02B 6/42*     (2006.01)

(52) U.S. Cl.
CPC .............. *G02B 6/4272* (2013.01); *G02B 6/42* (2013.01); *G02B 6/4212* (2013.01); *G02B 6/4214* (2013.01); *G02B 6/4269* (2013.01); *G02B 6/423* (2013.01); *G02B 6/4234* (2013.01); *G02B 6/4246* (2013.01)

(58) Field of Classification Search
None
See application file for complete search history.

(56) References Cited

U.S. PATENT DOCUMENTS

| | | | |
|---|---|---|---|
| 6,285,808 B1 * | 9/2001 | Mehlhorn et al. | 385/14 |
| 7,062,144 B2 * | 6/2006 | Hwang et al. | 385/139 |
| 7,263,248 B2 * | 8/2007 | Windover | 385/14 |
| 8,727,641 B2 * | 5/2014 | Hung | 385/93 |
| 9,057,853 B2 * | 6/2015 | Lau et al. | |
| 2002/0097962 A1 * | 7/2002 | Yoshimura et al. | 385/50 |
| 2004/0042705 A1 * | 3/2004 | Uchida et al. | 385/14 |
| 2004/0136099 A1 | 7/2004 | Kim et al. | 359/824 |
| 2005/0100264 A1 * | 5/2005 | Kim et al. | 385/14 |
| 2005/0141823 A1 * | 6/2005 | Han et al. | 385/89 |
| 2006/0104562 A1 * | 5/2006 | Rosch et al. | 385/14 |
| 2010/0061679 A1 | 3/2010 | Hayashi et al. | 385/14 |
| 2010/0215314 A1 * | 8/2010 | Lau et al. | 385/14 |
| 2013/0259431 A1 * | 10/2013 | Charbonneau-Lefort et al. | 385/89 |
| 2013/0330044 A1 * | 12/2013 | Wu | 385/76 |
| 2015/0098675 A1 * | 4/2015 | Ishiyama et al. | 385/14 |

* cited by examiner

Primary Examiner — Sung Pak
(74) Attorney, Agent, or Firm — Harrington & Smith (57) ABSTRACT

An optical circuit board including a top face, a bottom face, an optical layer buried between bottom and top faces, the optical layer being adapted to transmit optical signals, an opto-electronic component adapted to emit or receive light transmitted through the optical layer, a solid heat dissipative element adapted to dissipate heat generated at the opto-electronic component.

19 Claims, 9 Drawing Sheets

FIG. 9

OPTICAL CIRCUIT BOARD

FIELD OF THE INVENTION

The instant invention relates to optical circuit boards.

BACKGROUND OF THE INVENTION

Today, most communication systems involve a number of system-cards. Such cards are usually manufactured as so-called printed circuit boards (PCBs). Usually, some of the system-cards, which are called daughter boards, are assembled together on a rigid system-card called the backplane, or mother board.

The daughter boards usually extend parallel with each other and are interconnected together via the backplane, which extends perpendicular to them. There are several practical advantages to such a configuration: Easy insertion, removal, and replacement of the daughter-boards.

Because of the ever increasing requirements in data rates in communication systems, due for example to the Internet, the limits of using electrical communications between printed circuit boards (PCB) are being reached. It has become difficult to guarantee good signal integrity when transferring information at high frequencies (e.g. 25 Gb/s or higher) through electrical lines between two electrical components such as a printed circuit board.

To respond to this bandwidth demand, high-speed systems now use optical waveguide light to transfer light-carried information.

Light enables to improve the transfer of information between two points since light is less sensitive to interference phenomenon. High speed systems are now being built with optical layers (optical fibres or planar waveguides) incorporated in replacement of the electrically-conducting metal. An optical layer is disposed parallel to the average plane of the backplane. An other optical layer is disposed parallel to the average plane of the daughter board.

The daughter board may comprise a set of opto-electronic components which will either emit or detect light transmitted through its optical layer. U.S. Pat. No. 7,149,376 discloses one such embodiment.

With the stringent requirements for miniaturization, together with the ever-increasing demands for higher transmission rates, attention is now turning to the efficient thermal management of such systems.

SUMMARY OF THE INVENTION

To this aim, it is provided an optical circuit board comprising a top face and a bottom face.

The optical circuit board has an optical layer buried between the bottom and top faces. This optical layer can transmit optical signals.

The board comprises an opto-electronic component to emit or receive light transmitted through the optical layer.

The board further comprises a solid heat dissipative element adapted to dissipate heat generated at the opto-electronic component.

With these features, efficient thermal management of the opto-electronic component is provided at the board, using the heat dissipative element, which enables new gains in terms of data rates.

In some embodiments, one might also use one or more of the features defined in the dependant claims.

BRIEF DESCRIPTION OF THE DRAWINGS

Other characteristics and advantages of the invention will readily appear from the following description of eight of its embodiments, provided as non-limitative examples, and of the accompanying drawings.

On the drawings.

On the different figures, the same reference signs designate like or similar elements.

DETAILED DESCRIPTION

Figure 1:
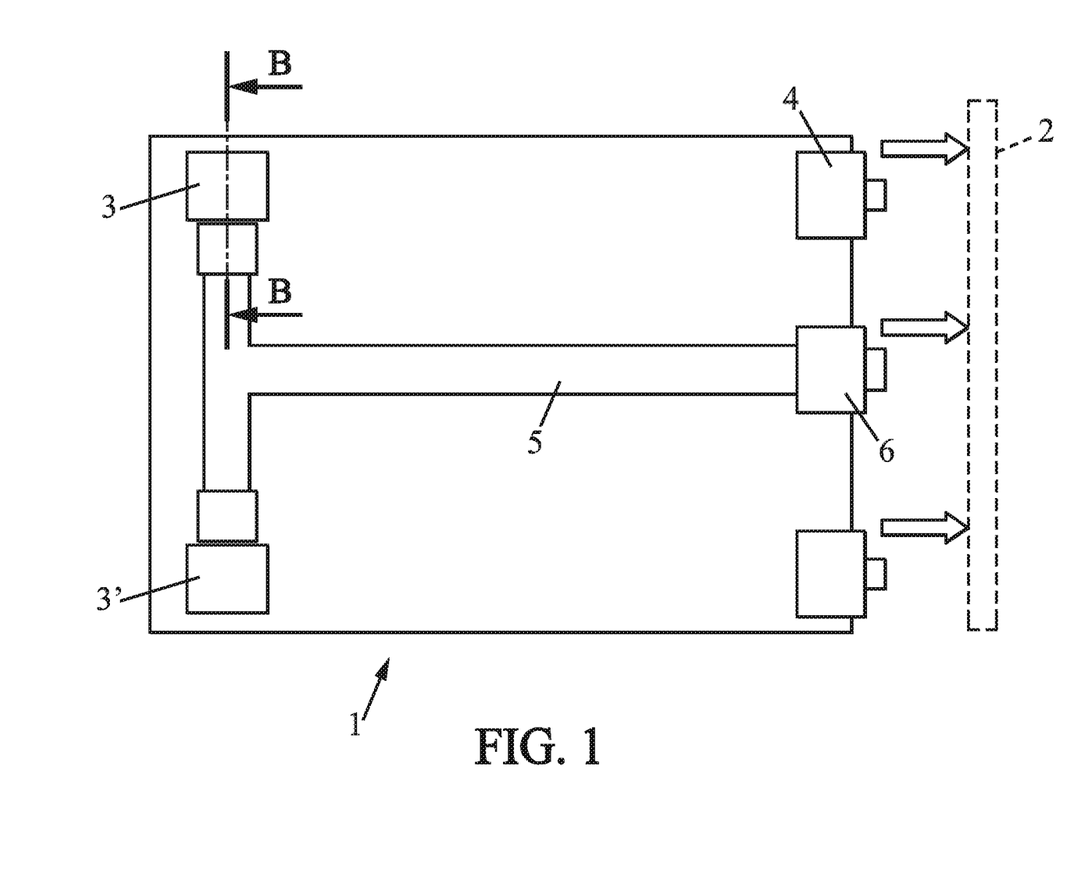
FIG. 1 is a top view of a daughter board according to a first embodiment.

FIG. 1 schematically shows a system card 1 such as a daughter board to be connected to a mother board 2 of an optical communication system. The system card 1 may comprise a number of electronic components 3, as well as a number of electrical connectors 4 for electrical connection to the mother board 2. The system card 1 is an optical circuit board. The foot print of the optical layers is visible as reference 5 on FIG. 1. As visible, optical communications may be performed internally in the card 1 between two remote sets of electronic components 3, 3' and/or between one set of electronic components 3 and the mother board 2 through an optical connector 6. As shown on FIG. 2, the system card 1 extends between a top face 1a and a bottom face 1b. It is performed as a stack of layers. Electrical layers 7a, 7b are provided to guide electrical signals of the board 1. The electrical layer 7a is provided close to the top surface 1a and the electrical layer 7b close to the bottom surface 1b. Both may be protected by an outer insulating layer 8a, 8b. An optical layer 9 is buried between the top and bottom faces 1a, 1b of the board, and in the present example, between the electrical layers 7a, 7b, possibly with interposition of further insulating layers 8c, as shown. The optical layer 9 comprises a plurality of optical waveguides 10a, 10b embedded in cladding 11. Light will be propagated in the optical waveguides 10a, 10b in the system card 1. Light propagates in a plane parallel to the top and bottom faces of the printed circuit board, for example along a direction X, on FIG. 2. In the present example, the waveguides are provided in plurality of rows offset with respect to one another along the direction Z. A top row of waveguides 10a extends closer to the top face 1a of the circuit board than a bottom row of waveguides 10b. The present invention could be applied with one or more rows of waveguides. Although only one waveguide 10a, 10b is shown per row on FIG. 2, it will be understood that each row may comprise a plurality of waveguides offset with respect to one another along the direction Y, and separated from each other by cladding 11.

Figure 2:
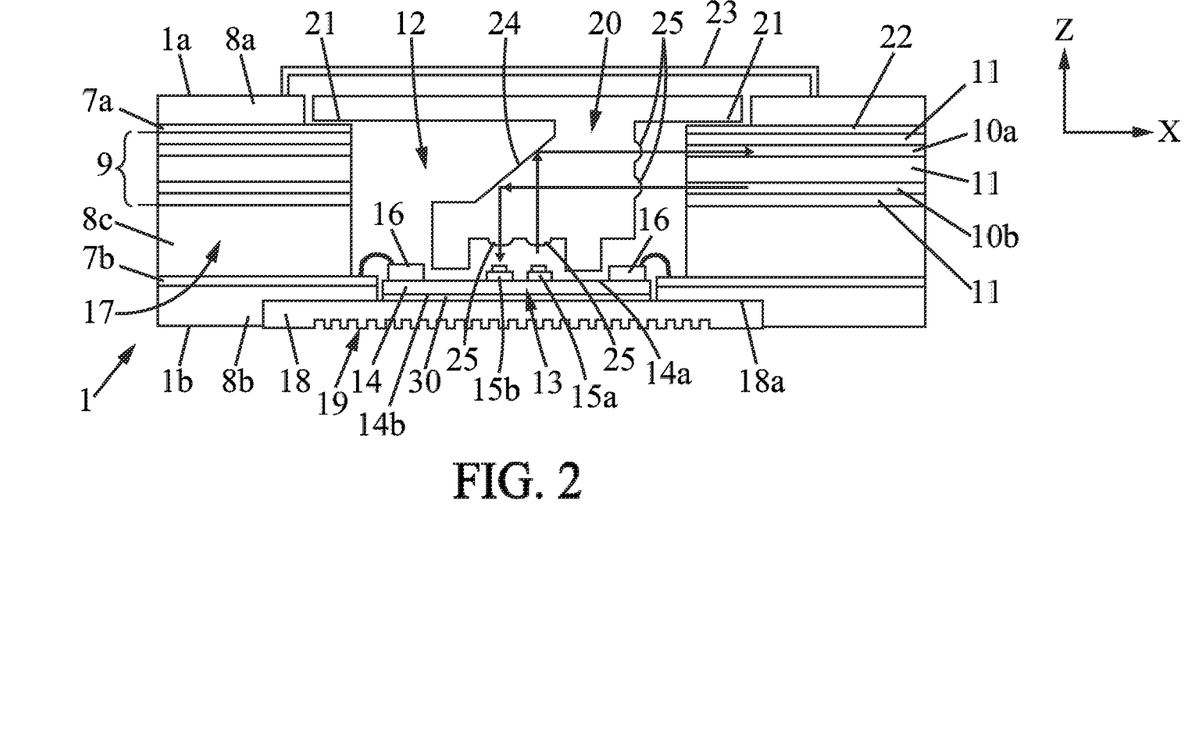
FIG. 2 is a partial sectional view along line B-B of FIG. 1 for the first embodiment.

A cavity 12 is provided in the system card 1. For example, the cavity is a through hole extending between the top and bottom faces 1a, 1b of the system card. The cavity may receive an optical engine 13. The optical engine 13 comprises a printed circuit board 14 carrying, on its top face 14a, opto-electronic components 15a, 15b and electronic control components 16. For example, it is provided one row of light emitting components 15a, offset along the direction Y and adapted to emit light to be directed toward the waveguides 10*a* of the top row and photo-diodes 15*b* are provided along one row, offset from one another along the direction Y, to receive light propagated through waveguides 10*b* of the bottom row. However, this lay-out is purely illustrative.

The printed circuit board 14 mainly comprises a heat-dissipating substrate, for example made of ceramic or of another material enabling effective heat-dissipation as well as being a support for electrical tracks (not shown) electrically joining the electronic control components 16 to the opto-electronic components 15*a*, 15*b*. The substrate has its bottom face 14*b* assembled to a heat dissipative element 30, such as a heat spreader. The heat spreader can for example be a thin foil of heat-dissipating material, such as copper. Thermal conductivity of at least 300 W/m·K are appropriate for such materials.

The electronic control components 16 are electrically connected to an electrical track of the system card 1, such as the bottom track 7*b* by wire bonding.

The electronic control components 16 are electrically connected to the opto-electrical components 15*a*, 15*b* to command and/or assist these components. Such components are for example light-emitting components 15*a* such as suitable VCSELs. The optical engine 13 is provided and assembled to the body 17 of the system card such that the light emitting components 15*a* emit light along the direction Z toward the top face 1*a* of the card. The opto-electrical components 15*b* are for example photo-diodes which are adapted to receive light. These photo-diodes 15*b* are also positioned so that they can detect light propagated along the direction Z toward them, directed toward the bottom face 1*b* of the card.

An additional heat dissipative element, such as a heat sink 18 is provided in close proximity to the opto-electrical components 15*a*, 15*b*. For example, the heat sink 18 has a plane face 18*a* which is assembled, for example glued to the heat spreader 30, and in particular to a bottom face thereof. The heat sink 18 further comprises a heat transfer region 19 where the ratio of surface to volume is high, and accessible from the outside of the system card so as to receive a suitable cooling fluid such as air ventilated in the device receiving the system card, or the like. For example, the heat transfer region 19 will be accessible from the bottom face 1*b* of the system card 1.

The heat sink 18 may further be assembled, for example glued, to the body 17 of the system card 1 for mechanical fixation. Thus, the heat sink 18 is directly supported by the optical circuit board.

According to a variant, the heat sink 18 (or additional heat dissipative element) is replaced by a heat spreader. Thus the heat spreader 30 and the additional heat dissipative element can be made as a single piece. In such a case, the heat spreader is configured to contact a heat exchanger, e.g. a heat sink.

The system card 1 further comprises an optical coupling device 20.

The optical coupling device 20 is an integral piece made from a translucent material, and adapted to optically couple light between the waveguides 10*a*, 10*b* and the opto-electrical components 15*a*, 15*b*.

The optical coupling device 20 is precisely positioned with respect both to the optical waveguides 10*a*, 10*b* and to the opto-electrical components 15*a*, 15*b*. In particular, the position of the optical coupling device 20, along the direction Z with respect to the optical waveguides 10*a*, 10*b* is precisely defined. For example, a Z-reference 21 of the optical coupling device 20 will cooperate with a Z-reference layer 22 of the system card 1, the position of which is precisely known with respect to the optical waveguides 10*a*, 10*b*. The Z reference layer 22 of the card 1 is for example the electrical layer 7*a*, in direct contact with the cladding 11.

Further, the position of the optical coupling device 20 along the direction X with respect to the opto-electronic components 15*a*, 15*b*, is precisely defined. For example, the optical coupling device 20 is placed, along direction X, taking into account reference marks performed in the system card 1 and exactly showing the location of the opto-electronic components 15*a*, 15*b* along the direction X.

The position of the optical coupling device 20 with respect to both the optical waveguides 10*a*, 10*b* and the opto-electronic components 15*a*, 15*b* along direction Y is precisely defined, for example by precisely defining the position of the optical coupling device 20 with respect to the opto-electronic components using the same reference marks as for the positioning along the direction X. By construction, the positioning of the opto-electronic components 15*a*, 15*b* along direction Y with respect to the optical waveguides 10*a*, 10*b* needs to be very precise. Therefore, when the optical coupling device 20 will be aligned along direction Y with the opto-electronic components 15*a*, 15*b*, it will necessarily be aligned along direction Y with the optical waveguides 10*a*, 10*b*.

When the optical coupling device 20 is located in the precise position, it is fixed in position to the body 17 for example by gluing or the like.

The cavity 12 is sealed to prevent any ingress of matter. For example, the bottom of the cavity 12 is sealed by the heat sink 18, and the top of the cavity is sealed by a protective cover 23.

The optical coupling device comprises a mirror 24 to reflect light between the opto-electrical components 15*a*, 15*b*, which emit or receive light along direction Z, and the optical waveguides 10*a*, 10*b* which propagate light along direction X. For example, the mirror 24 is a planar mirror forming a 45 degrees angle with the X-Y plane.

The optical coupling device 20 further comprises light-beam forming structures 25 to improve the coupling of the light between the optical waveguides 10*a*, 10*b* and the opto-electrical components 15. Such light-beam forming structures may for example be suitable lenses.

Figure 3:
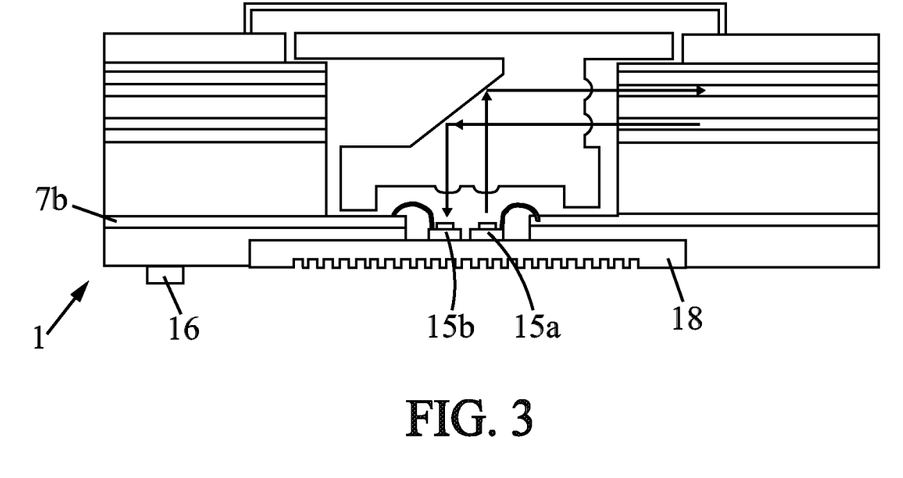
FIGS. 3 to 8 are views similar to FIG. 2 for second to seventh embodiments of the invention respectively.

FIG. 3 now shows a second embodiment of the invention. Compared to the embodiment of FIG. 2, the embodiment of FIG. 3 differs in that one does not use a heat-dissipating printed circuit board 14. It does not either use a heat spreader. In the following embodiments, as well as in the above embodiment, the heat spreader may be optional. Thus, the opto-electrical components 15*a*, 15*b* are directly fixed to the heat sink 18. The opto-electrical components 15*a*, 15*b* are connected electrically to an electrical track of the system card 1, such as the bottom card 7*b*, by wire bonding. The electronic control components 16 are therefore provided directly on the body of the system card and electrically connected to the electrical layer 7*b* by any suitable way.

Figure 4:
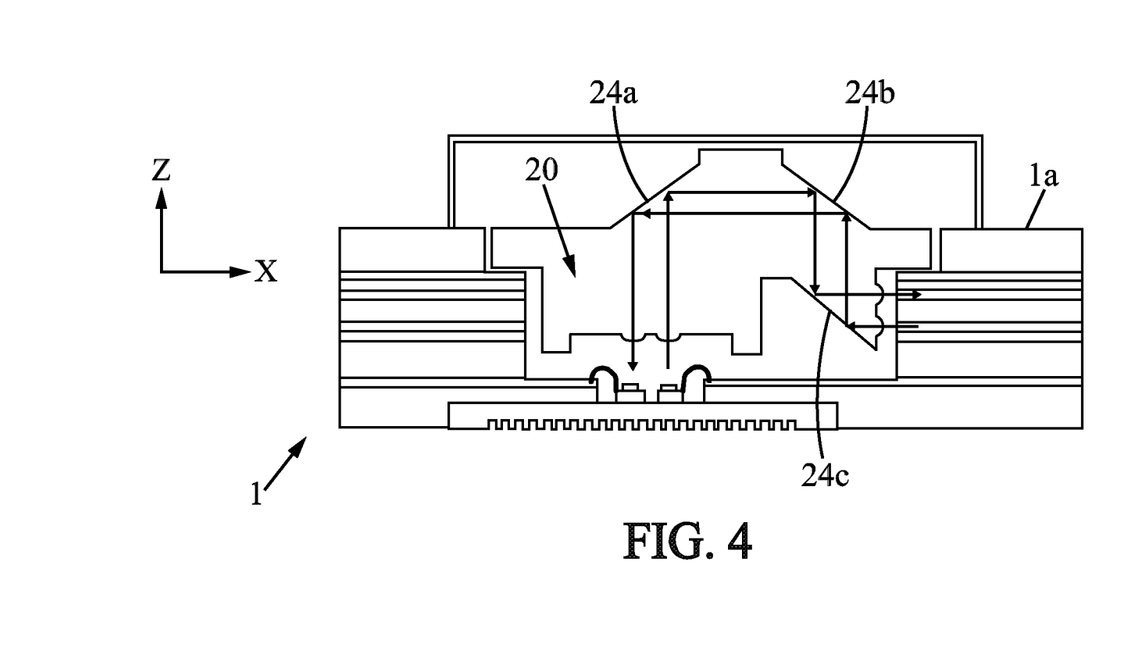

FIG. 4 now shows a third embodiment. Compared to the embodiment of FIG. 3, the main difference lies in the geometry of the optical coupling device 20. There will be a longer optical path inside the optical coupling device, for example by providing a plurality of mirrors 24, 24*b*, 24*c* between the interfaces of the optical coupling device. The optical coupling device 20 may even project from the top face 1*a* of the board 1, and light may even propagate inside the optical coupling device in a plane higher along direction Z, than the top face 1*a* of the card 1.

Figure 5:
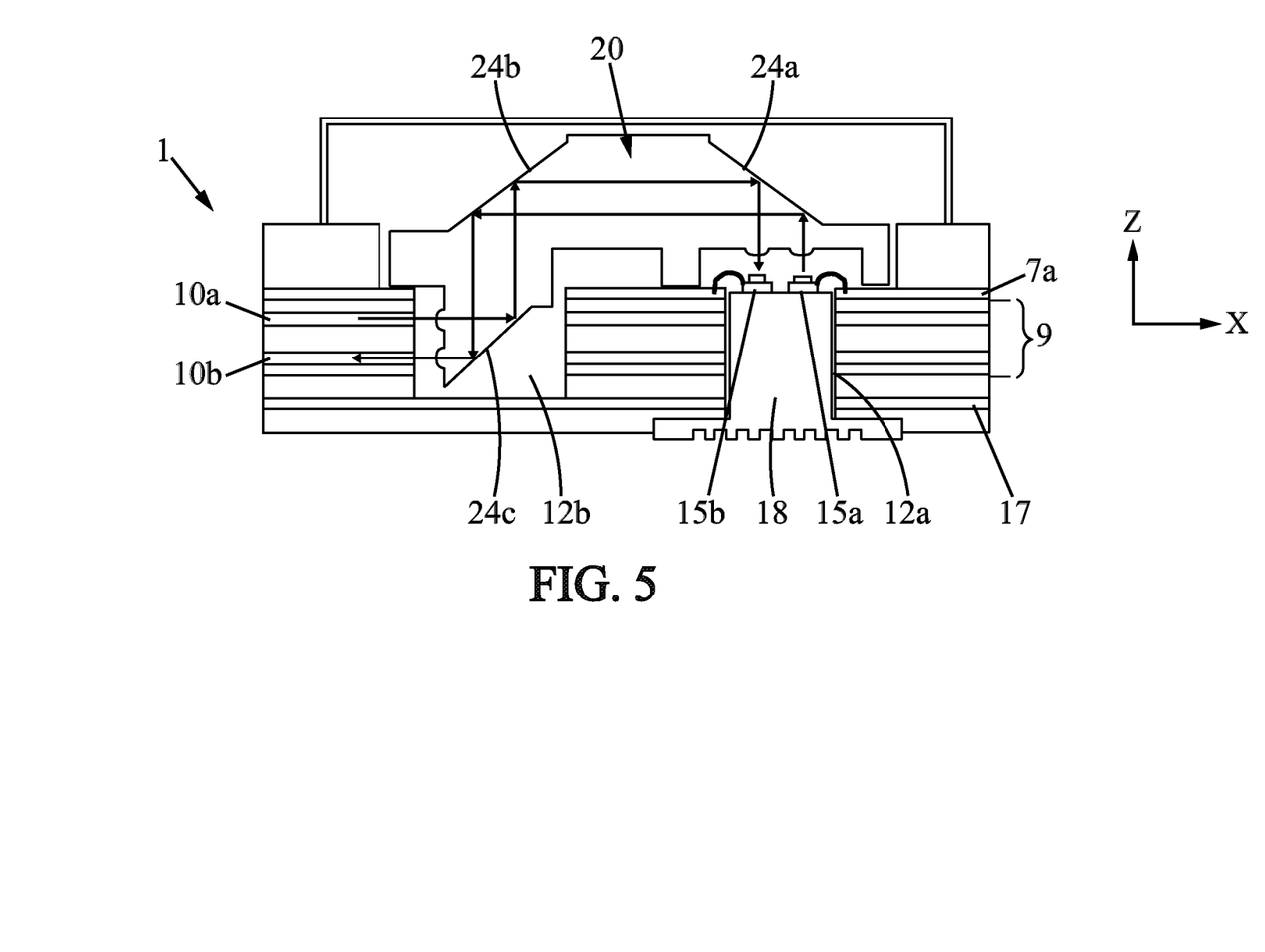

FIG. 5 now shows a fourth embodiment. Compared to the embodiment of FIG. 3, it differs in that the opto-electrical components 15*a*, 15*b* are electrically connected to the top electrical layer 7*a* of the board 1. Two cavities 12*a*, 12*b* are provided in the body 17 of the card 1. The cavity 12*a* receives the heat sink 18 which extends also at the level of the optical layer 9, up to the top electrical layer 7a. The second cavity 12b receives a portion of the optical coupling device 20. Light emitted from a laser 15a along direction Z upward is reflected by a first mirror 24a to propagate inside the coupling device 20 along direction X toward the left until it reaches a second mirror 24b where it is reflected along direction Z downwards, until a third mirror 24c, which extends in the second cavity 12b, directs light leftward again, along direction X, to the suitable optical waveguide 10b. In the present embodiment, light will propagate on the left hand side part of the optical layer 9. Light directed from a waveguide 10a toward a photodiode 15b will follow the reverse path.

Figure 6:
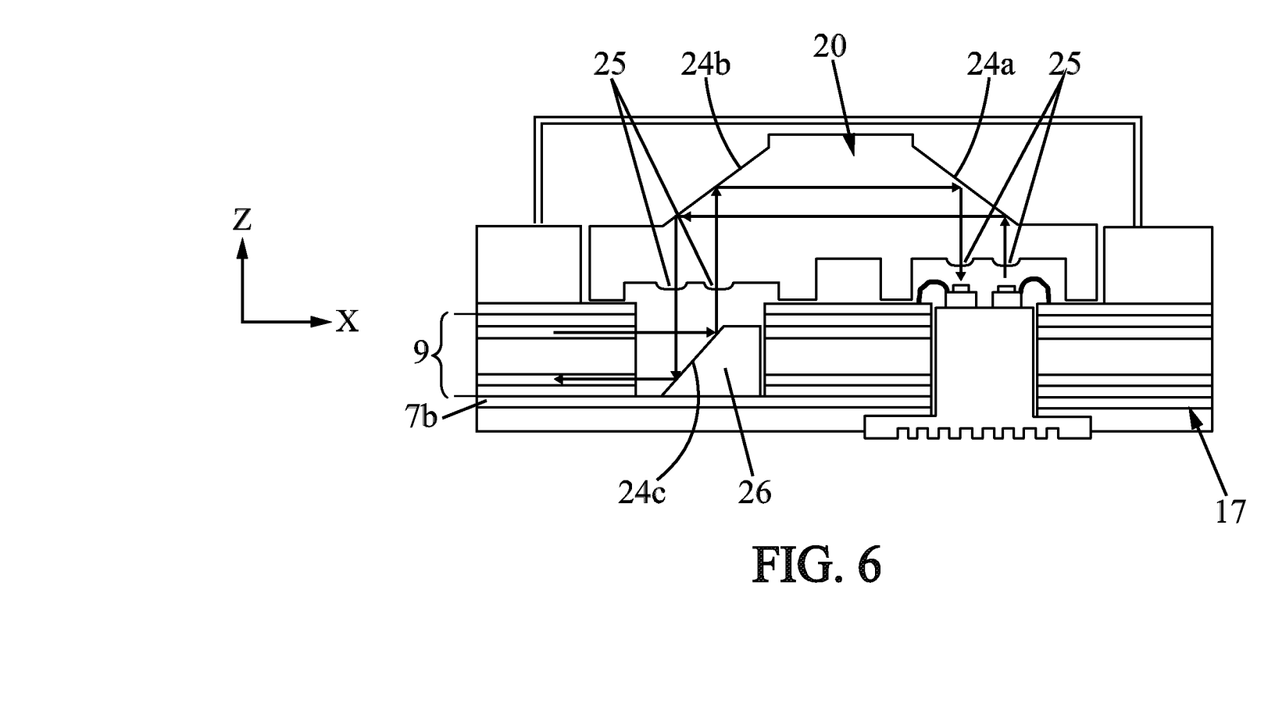

FIG. 6 now shows a fifth embodiment of the invention, which is described below in relation to FIG. 5. In this embodiment, there is an optical coupling system which comprises both an optical coupling device 20 and a separate mirror mount 26 fixed to the body of the card. Also, in this embodiment, there is no insulating layer 8c between the optical layer 9 and the bottom electrical layer 7b so that this layer 7b can act as a reference layer, the position of which is precisely known along direction Z with respect to the optical waveguides, to precisely position the mirror mount 26 along direction Z with respect to the waveguide. In this embodiment, the optical coupling device 20 comprises the top part of the optical coupling device 20 of the embodiment of FIG. 5, but not the third mirror 24c. The third mirror 24c is now integral with the mirror mount 26. The light beam forming structures 25 are provided where light enters in or exits from the optical coupling device 20, and dimensioned accordingly.

Figure 7:
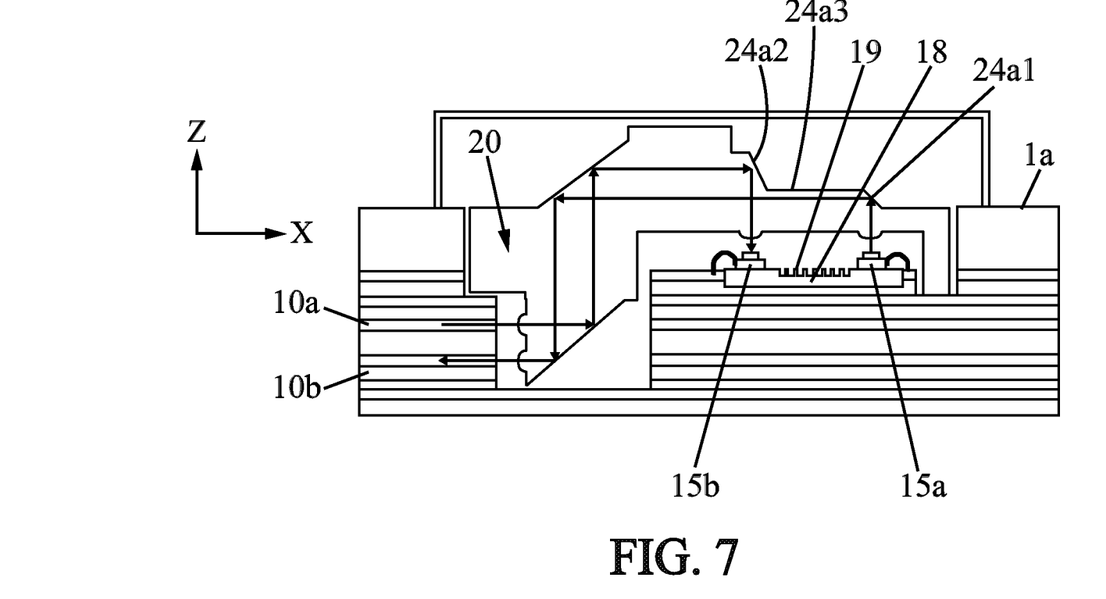

FIG. 7 now shows a sixth embodiment. In this embodiment, the optical coupling device 20 is similar to the one of the embodiment of FIG. 5, however with some differences which are detailed below.

Compared to the above embodiments, where the heat sink 18 is provided from the bottom side 1b of the card, the heat sink 18 is provided, in the present embodiment, from the top side 1a of the card. The heat transfer region 19 is thus oriented toward the top face 1a, i.e. upside down compared to the previous embodiments. Contrarily to the previous embodiments, the opto-electrical components 15a, 15b are mounted on the same face of the heat sink 18 as the face which comprises the heat transfer region 19. Hence, the opto-electrical components 15a, 15b are located around this region 19. As a consequence, they may be spaced apart from one another more than in the previous embodiments. To cope with this additional spacing, the mirror 24a may be split into separate mirror portion 24a1, 24a2, which are connected together by a flat horizontal portion 24a3 extending in the X-Y plane (or a less inclined region). Providing such offset mirrors enables to cope with the difference of spacing between the spacing of the opto-electrical components 15a, 15b and the spacing of the waveguides 10a, 10b along direction Z.

Figure 8:
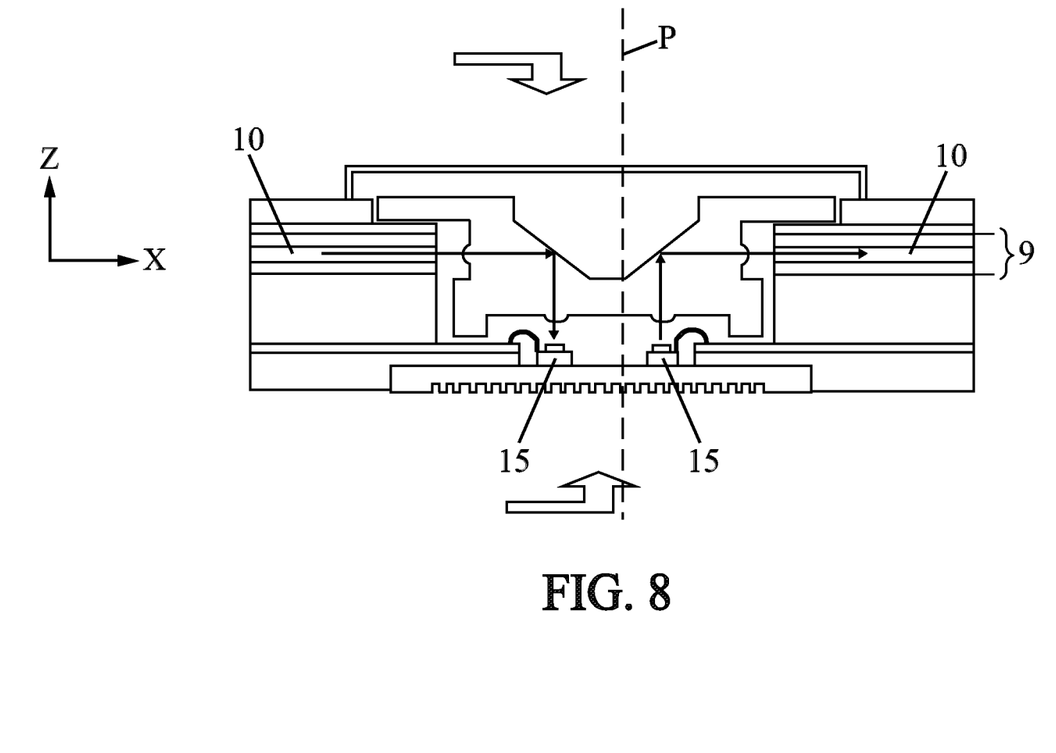

FIG. 8 now shows a seventh embodiment of the invention. This embodiment will be described here in relation to the embodiment of FIG. 3. Compared to the embodiment of FIG. 3, the optical layer 9 comprises only one row of optical waveguides 10. The system is provided as being symmetrical with respect to a mid-plane P parallel to the Y-Z axis, whereby, to the right of the plane P, light will be coupled between the waveguide 10 and the opto-electrical component 15 in a way similar to FIG. 3. On the left of plane P, light will be coupled between an optical waveguide 10 and an opto-electrical component 15 in a symmetrical way. In such way, both sides (left-hand side and right-hand side) of the optical layer 9 are used, compared to the above embodiments where only one side of the optical layer is used.

It should be noted that, in the context of the present invention, it is possible to replace the heat sink of the embodiments depicted in FIGS. 2 to 8 by a heat spreader.

Figure 9:
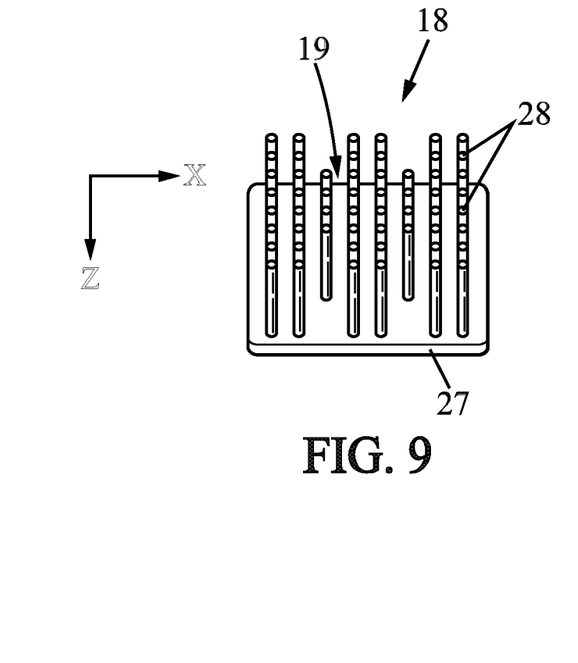
FIG. 9 is a perspective view of heat sink suitable for use in any of the above embodiments.
Figure 10:
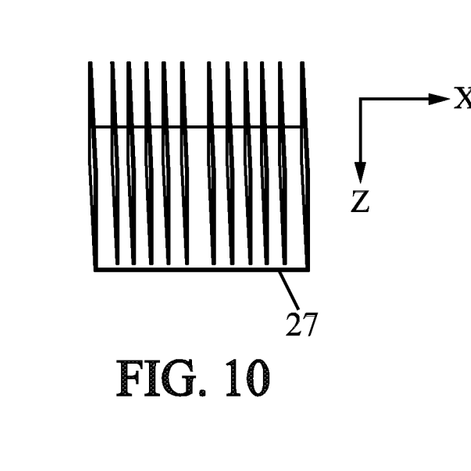
FIG. 10 is a view similar to FIG. 9 for an eighth embodiment.

FIG. 9 shows an example of a heat sink 18 suitable for any of the above embodiments. It is a rigid component which can be assembled to the body of the card. The heat sink is for example provided in a heat-dissipating material, such as aluminium. Thermal conductivity of at least 150 W/m·K may be appropriate for such a device. If the heat sink is provided in an electrically conductive material, care will be taken to insulate the heat sink from the electrical tracks 7 of the card 1. Preferably, the heat sink will be assembled to insulative material 8 of the card 1. Assembly can be provided using suitable heat-dissipative glue, for example. In the embodiment of FIG. 9, the heat sink 18 is provided with a base plate 27 from which the heat transfer region 19 extends. The heat transfer region 19 is for example provided as a plurality of straight pins which extend along the direction Z. As shown in the variant embodiment of FIG. 10, the pins 28 are replace by plates 29 which extend in the Y-Z plane. This embodiment may be useful when the coolant flows preferably along the direction Y in the device.

Within the frame of the invention, some embodiments may be obtained by combining some of the features of different above-described embodiments, when applicable.

The invention claimed is:

1. An optical circuit board comprising:
    a top face,
    a bottom face,
    an optical layer buried between said bottom and top faces, said optical layer being adapted to transmit optical signals,
    an opto-electronic component adapted to emit or receive light transmitted through said optical layer,
    a solid heat dissipative element adapted to dissipate heat, generated at the opto-electronic component, and
    a cavity extending between the top and bottom faces, wherein the solid heat dissipative element is mounted in the cavity from the bottom face.

2. Optical circuit board according to claim 1, wherein the heat dissipative element is a heat spreader.

3. Optical circuit board according to claim 1, wherein the heat dissipative element is a heat sink.

4. Optical circuit board according to claim 1, wherein the heat dissipative element is directly fixed to the optical circuit board.

5. Optical circuit board according to claim 1, wherein the opto-electronic component is directly fixed to the solid heat dissipative element.

6. Optical circuit board according to claim 1, wherein the opto-electronic component is fixed to the solid heat dissipative element through a heat-dissipative printed circuit board substrate.

7. Optical circuit board according to claim 6, wherein the heat-dissipative printed circuit board substrate is made of ceramics.

8. An optical circuit board having a body comprising:
    a top face,
    a bottom face,
    an optical layer buried between said bottom and top faces, said optical layer being adapted to transmit optical signals,
    an optical engine fixed to the body and comprising:
    a heat-dissipating printed circuit board substrate made of ceramics, an opto-electronic component carried by the substrate and adapted to emit or receive light transmitted through said optical layer, a control component carried by the substrate, electrically connected to the optoelectronic component on the substrate, a solid heat sink fixed to the heat-dissipating printed circuit board substrate and adapted to dissipate heat generated at the opto-electronic component, and a cavity extending between the top and bottom faces, wherein the solid heat sink is mounted in the cavity from the bottom face.

9. Optical circuit board according to claim 1 further comprising a cover mounted to the top face adapted to seal the cavity.

10. Optical circuit board according to claim 1, wherein the opto-electronic component and/or the heat dissipative element are located between the top and bottom faces.

11. An optical circuit board comprising:
a top face,
a bottom face,
a cavity extending between the top and the bottom faces,
an optical layer buried between said bottom and top faces, said optical layer being adapted to transmit optical signals,
an opto-electronic component adapted to emit or receive light transmitted through said optical layer,
a solid heat dissipative element adapted to dissipate heat generated at the opto-electronic component, mounted in the cavity from the bottom face, wherein the solid heat dissipative element is mounted in the cavity from the bottom face, and
a cover mounted to the top face adapted to seal the cavity.

12. Optical circuit board according to claim 1, further comprising an optical coupling device adapted to optically couple the opto-electronic component to the buried optical layer.

13. Optical circuit board according to claim 12, wherein the optical coupling device comprises a mirror adapted to deflect light between the opto-electronic component and the buried optical layer.

14. Optical circuit board according to claim 12, wherein the optical coupling device comprises a light-beam forming structure adapted to optically couple the opto-electronic component to the buried optical layer.

15. An optical circuit board comprising:
a top face,
a bottom face,
an optical layer buried between said bottom and top faces, said optical layer being adapted to transmit optical signals,
an opto-electronic component adapted to emit or receive light transmitted through said optical layer,
a solid heat dissipative element adapted to dissipate heat generated at the opto-electronic component,
an optical coupling device adapted to optically couple the opto-electronic component to the buried optical layer, and
a cavity extending between the top and bottom faces, wherein the solid heat dissipative element is mounted in the cavity from the bottom face,
wherein the optical coupling device comprises a mirror adapted to deflect light between the opto-electronic component and the buried optical layer, wherein the optical coupling device comprises a light-beam forming structure adapted to optically couple the opto-electronic component to the buried optical layer.

16. Optical circuit board according to claim 14, wherein the light-beam forming structure is adapted to optically couple the opto-electronic component to the optical coupling device and/or wherein the light-beam forming structure is adapted to optically couple the buried optical layer to the optical coupling device.

17. Optical circuit board according to claim 1, comprising at least one optical waveguide buried between said bottom and top faces, said optical waveguide being adapted to transmit optical signals, comprising at least one opto-electronic component adapted to emit light transmitted through one optical waveguide and comprising at least one opto-electronic component adapted to receive light transmitted through one optical waveguide.

18. Optical circuit board according to claim 1, comprising a single optical coupling device adapted to optically couple the opto-electronic components to the buried optical layer(s).

19. Optical circuit board according to claim 1, further comprising an electrically conductive layer, and wherein the opto-electronic component is electrically connected to the electrically conductive layer through wire bonding.

* * * * *